US009935354B2

(12) United States Patent
Boglione et al.

(10) Patent No.: US 9,935,354 B2
(45) Date of Patent: Apr. 3, 2018

(54) FREQUENCY TUNABLE BALUN

(71) Applicant: The United States of America, as represented by the Secretary of the Navy, Washington, DC (US)

(72) Inventors: Luciano Boglione, Alexandria, VA (US); Joel I. Goodman, Alexandria, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 53 days.

(21) Appl. No.: 15/131,903

(22) Filed: Apr. 18, 2016

(65) Prior Publication Data

US 2016/0308511 A1 Oct. 20, 2016

Related U.S. Application Data

(60) Provisional application No. 62/148,956, filed on Apr. 17, 2015.

(51) Int. Cl.
*H03H 7/42* (2006.01)
*H01P 1/10* (2006.01)
*H01P 5/10* (2006.01)

(52) U.S. Cl.
CPC .................................... *H01P 5/10* (2013.01)

(58) Field of Classification Search
CPC .................................... H03H 7/42; H01P 5/10
USPC .................................... 333/25, 26
See application file for complete search history.

(56) References Cited

U.S. PATENT DOCUMENTS 6,674,340 B2 * 1/2004 Quan ..................... H01P 1/127 333/164
7,595,766 B2 * 9/2009 Rofougaran ............ H01Q 1/24 343/795
2011/0291768 A1 * 12/2011 Chen ..................... H03H 7/42 333/25
2013/0034088 A1 * 2/2013 Joshi ..................... H01Q 1/246 370/337

* cited by examiner

*Primary Examiner* — Dean Takaoka
(74) *Attorney, Agent, or Firm* — US Naval Research Laboratory; William P. Ladd

(57) ABSTRACT

Systems and method are provided for making a balun's operational bandwidth tunable around multiple distinct center frequencies by using switches to vary the balun's dimensions. An embodiment of the present disclosure uses a pass gate structure for the switches, and the switches connect additional lengths of line in or out of the balun to change its frequency response. A balun in accordance with an embodiment of the present disclosure is able to switch its response between 2 or more adjacent bands by switching additional length of lines in and out of the balun's core windings.

18 Claims, 6 Drawing Sheets

FREQUENCY TUNABLE BALUN

CROSS REFERENCE TO RELATED APPLICATIONS

This application claims the benefit of U.S. Provisional Patent Application No. 62/148,956, filed on Apr. 17, 2015, which is incorporated by reference herein in its entirety.

FIELD OF THE DISCLOSURE

This disclosure relates to baluns, including tunable baluns.

BACKGROUND

Mixed signal circuits are commonly implemented in silicon technology across wider and wider regions of the spectrum. Baluns are useful to transform balanced signals into un-balanced signals and vice-versa. Broadband response, low loss, magnitude and phase imbalance are key performance specifications for the balun designer. However, it is a challenge to demonstrate reasonable performance particularly when implemented in a silicon technology.

On-chip integration of multiple functionalities can only be achieved in a conventional silicon process when low cost and large production volumes are required. The drive to higher and higher data rates is leading silicon technology towards the mm-wave spectrum providing the push for demonstrations of new circuit functionalities at higher and higher frequencies. In this context, the balun may be a key component to address when designing complex systems-on-a-chip design.

Baluns can be used to allow a balanced, differential signal to be transformed into an unbalanced, single-ended signal and vice versa. Differential signals experience less loss from a substrate than single-ended signals as they propagate through the circuit. This property is of particular interest when the frequency of operation is in the microwave and mm-wave region. Further, substrate loss is an additional challenge to consider when silicon is used for the integration of a high frequency system on a single chip.

BRIEF DESCRIPTION OF THE DRAWINGS/FIGURES

The accompanying drawings, which are incorporated in and constitute part of the specification, illustrate embodiments of the disclosure and, together with the general description given above and the detailed descriptions of embodiments given below, serve to explain the principles of the present disclosure. In the drawings.

Figure 1:
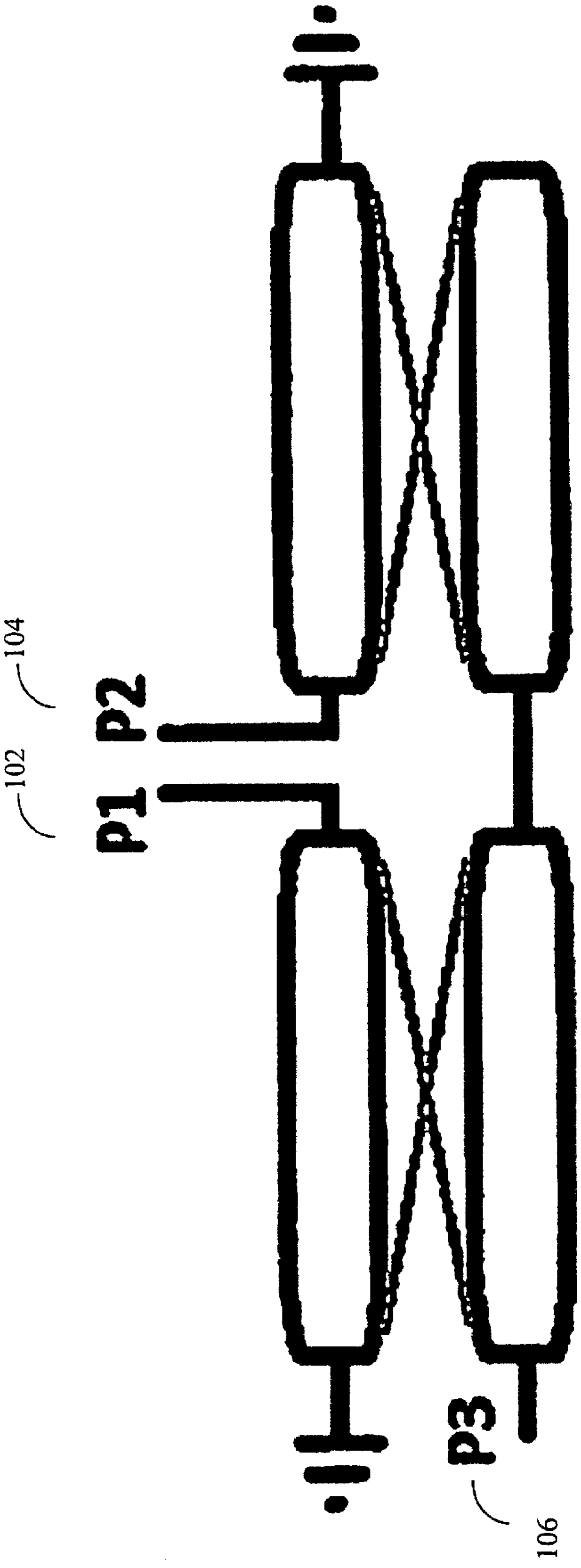
FIG. 1 is a diagram that shows an equivalent circuit of an embodiment of a balun network in accordance with an embodiment of the present disclosure.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

In the following description, numerous specific details are set forth to provide a thorough understanding of the disclosure. However, it will be apparent to those skilled in the art that the disclosure, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of this discussion, the term "module" shall be understood to include one of software, or firmware, or hardware (such as circuits, microchips, processors, or devices, or any combination thereof), or any combination thereof. In addition, it will be understood that each module can include one, or more than one, component within an actual device, and each component that forms a part of the described module can function either cooperatively or independently of any other component forming a part of the module. Conversely, multiple modules described herein can represent a single component within an actual device. Further, components within a module can be in a single device or distributed among multiple devices in a wired or wireless manner.

1. OVERVIEW

Embodiments of the present disclosure provide systems and methods for making a balun's operational bandwidth tunable around multiple distinct center frequencies by using switches to vary the balun's dimensions. An embodiment of the present disclosures provide a tunable, broadband Marchand balun that operates in the K band frequency range. For example, tunability can mean the ability to switch between well distinct frequency bands.

For example, in accordance with an embodiment of the present disclosure, a balun can be tuned around 2 frequencies and can be implemented using commercially available silicon Bipolar Complementary Metal-Oxide Semiconductor (BiCMOS) technology which makes use of the process' native Metal-Oxide Semiconductor (MOS) devices to design the required switches. An embodiment of the present disclosure uses a pass gate structure for the required switches, and the switches connect additional lengths of line in or out of the balun to change its frequency response. Because different line lengths correspond to different frequencies, the frequency response of the balun can be changed by switching in or out the different lengths of line. A balun in accordance with an embodiment of the present disclosure is able to switch its response between 2 adjacent bands by switching additional length of lines in and out of the balun's core windings. Pass gate structures provide the switch to control the insertion of the additional lines.

2. DIFFERENTIAL SIGNALS

Any electrical circuit with at least 2 nodes can be described in terms of differential signals. The relationship between the original single-ended current $I_e$ and voltage $V_e$ at the 2 nodes i and j and the differential and common mode at the same nodes can be represented as $$V_{dij}=V_{ei}-V_{ej} \quad [1]$$

$$I_{dij}=(I_{ei}-I_{ej})/2 \quad [2]$$

for the differential mode; and $$V_{eij}=(V_{ei}+V_{ej})/2 \quad [3]$$

$$I_{eij}=I_{ei}+I_{ej} \quad [4]$$

for the common mode.

Differential and common mode currents and voltages can be either independent or dependent of each other. The interaction between differential and common modes at each port and among the ports of a network can be described by the mixed-mode scattering parameters matrix $\hat{S}$. The mixed-mode scattering parameters matrix is an equivalent representation of the network of the (single-ended) scattering matrix S. Single-ended scattering parameters—i.e. the elements of the corresponding scattering matrix—are based on the definition of incident act and reflected be, voltage wave at each node. A proper linear combination of single-ended scattering waves can generate the corresponding differential and common mode voltage waves at each pair of nodes of interest.

2. BALUNS

A balun in accordance with an embodiment of the present disclosure is a passive network with at least 3 nodes. The actual number of nodes can depend on the particular balun's embodiment, but for the purpose of this section, 3 nodes are considered. Each of the 3 nodes can be associated with a single-ended incident and reflected wave. However, differential and common mode incident and reflected waves at 2 nodes help simplify the electrical description of the balun operation.

FIG. 1 is a diagram that shows an equivalent circuit of an embodiment of a balun network in accordance with an embodiment of the present disclosure. Port P1 102 and port P2 104 are used to define the differential $a_d$, $b_d$, and common mode $a_c$, $b_c$ incident and reflected waves, respectively, while port P3 106 is the single-ended port and defines the single-ended incident and reflected $a_e$, $b_e$ waves. The purpose of the balun of FIG. 1 is to ensure that the signal that enters single-ended port P3 106 is delivered to a differential load between ports P1 102 and P2 104. At the same time, no signal must be delivered to an external load connected to the common mode port.

In an embodiment, the balun of FIG. 1 is a Marchand balun. A Marchand balun in accordance with an embodiment of the present disclosure can be considered as 2 coupled line cascaded together and properly terminated as shown in FIG. 1: the single-ended input port feeds one of the lines, and the differential output port is defined between the coupled lines. A balun structure can be characterized by single-ended scattering parameter measurements which can then used to determine magnitude and phase imbalance. Alternatively, mixed-signal scattering parameters can also be used to capture the balun's performance in terms of differential and common modes.

In terms of mixed signal scattering parameters, the expression:

$$\begin{bmatrix} b_d \\ b_c \\ b_e \end{bmatrix} = \begin{bmatrix} 0 & 0 & 1 \\ 0 & 1 & 0 \\ 1 & 0 & 0 \end{bmatrix} \begin{bmatrix} a_d \\ a_c \\ a_e \end{bmatrix} \quad [5]$$

describes the operation of an ideal balun, where:

$$\hat{S} = \begin{bmatrix} 0 & 0 & 1 \\ 0 & 1 & 0 \\ 1 & 0 & 0 \end{bmatrix} \quad [6]$$

However, baluns can only approximate the mixed signal matrix $\hat{S}$ in [6] and the matrix elements depart from their ideal values over frequency. In an embodiment, the balun designer aims at approximating $\hat{S}$ at a given center frequency $f_o$ and possibly over a range of frequencies around $f_o$ as broad as possible depending on the application.

The transformation between differential and single ended modes can be achieved in a number of ways. While much effort has been focusing on extending its frequency response, tunability of the balun to different bands remains a challenge. Embodiments of the present disclosure provide systems and methods to addresses the issue of tunability of a balun. An embodiment of the present disclosure has been developed using silicon technology. Its tunable operation is at K band—around 20 GHz—due to the limitation of the available process. Other embodiments of the preset disclosure can be easily tailored to higher frequencies by selecting an appropriate MOS device technology.

3. FREQUENCY TUNABLE BALUN

Embodiments of the present disclosure make use of switches to enable a balun (e.g., in an embodiment, a Marchand balun) to be tunable and to overcome the limitations inherent to a standard balun implementation described in the previous section. Any embodiment of a switch can be used in accordance with embodiments of the present disclosure. In an embodiment, the switches allow transmission lines to be included or removed from the main signal path determined by the balun windings. In an embodiment, any transmission line whose effect is equivalent to change the physical length of the balun windings can be used in accordance with embodiments of the present disclosure. In an embodiment, a transmission line's physical length determines the performance of the balun because the wavelength associated with the signal is comparable to the line length: longer lines will optimize the balun performance at lower frequency; shorter lines will make the balun operate at higher frequency. Because different line lengths correspond to different frequencies, the frequency response of the balun can be changed by switching in or out the different lengths of line.

The desired length of transmission line can be determined based on the desired frequency based on equations that describe properties of signals passing through transmission lines. For example, in an embodiment, the voltage V at the end of a length l of transmission line can be represented by the expression $V=V_o e^{-jkl}$, where $V_o$ is the input voltage, and k is equivalent to $2\pi/\lambda$ ($\lambda$ representing the wavelength of the signal through the transmission line). In an embodiment, the desired frequency f can be represented based on the equation $f=c/\lambda$, where c is the speed of propagation through the transmission line. Thus, based on a known desired frequency of operation for a balun, a corresponding desired transmission line length can be determined.

3.1 Exemplary Balun Circuit

Figure 2A:
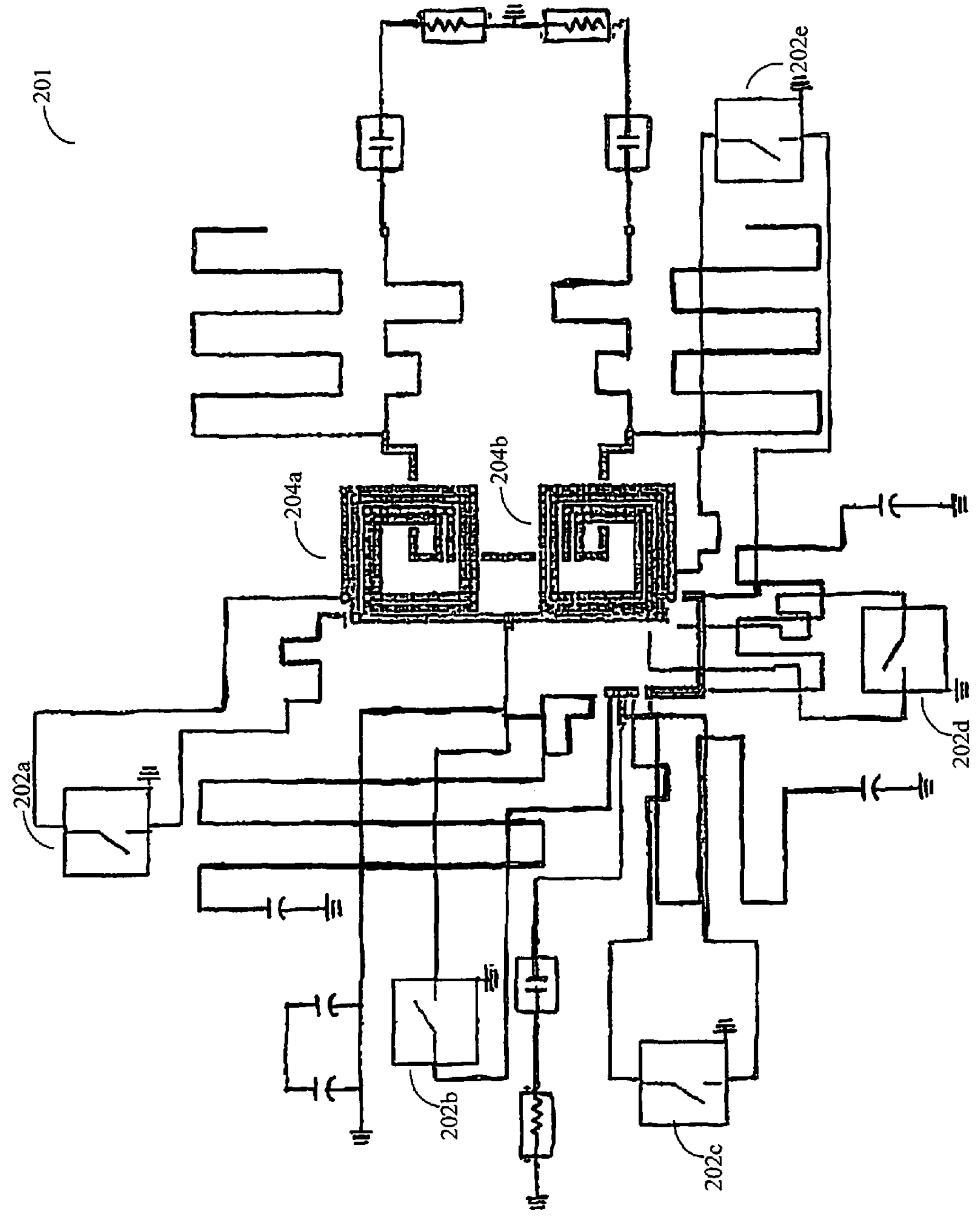
FIG. 2A is a diagram of an exemplary balun circuit that achieves tunability by using switches to connect or disconnect lengths of lines constituting the windings of the balun as discussed above.

FIG. 2A is a diagram of an exemplary balun circuit 201 that achieves tunability by using pass gate switches ("switches") 202 to connect or disconnect lengths of lines constituting the windings of the balun as discussed above. The embodiment of FIG. 2A has 5 switches 202*a-e*. In an embodiment, each switch 202 consists of 2 complementary MOS devices connected in parallel. In FIG. 2A, a single pass gate switch 202 is designed and instantiated 202*a*, 202*b*, 202*c*, 202*d*, and 202*e* multiple times in the circuit of FIG. 2A. In FIG. 2A, the lines connecting each pass gate 202 to windings 204 have the same lengths for every pass gate structure. Further, in FIG. 2A, additional stubs are added on the top metal layer at both the single-ended port and the differential ports to improve the matching across the tunable bandwidth.

In FIG. 2A, 1 switch 202*a* is used to add/remove an open stub to the top windings, and 4 switches 202*b-e* are used to route the single-ended signal through 2 transmission lines of different length in coordination with the top switch. Other embodiments of the present disclosure may require a different number of switches as seen fit by the designer embodying the invention.

3.2 Exemplary Pass Gate Switch

Figure 2B:
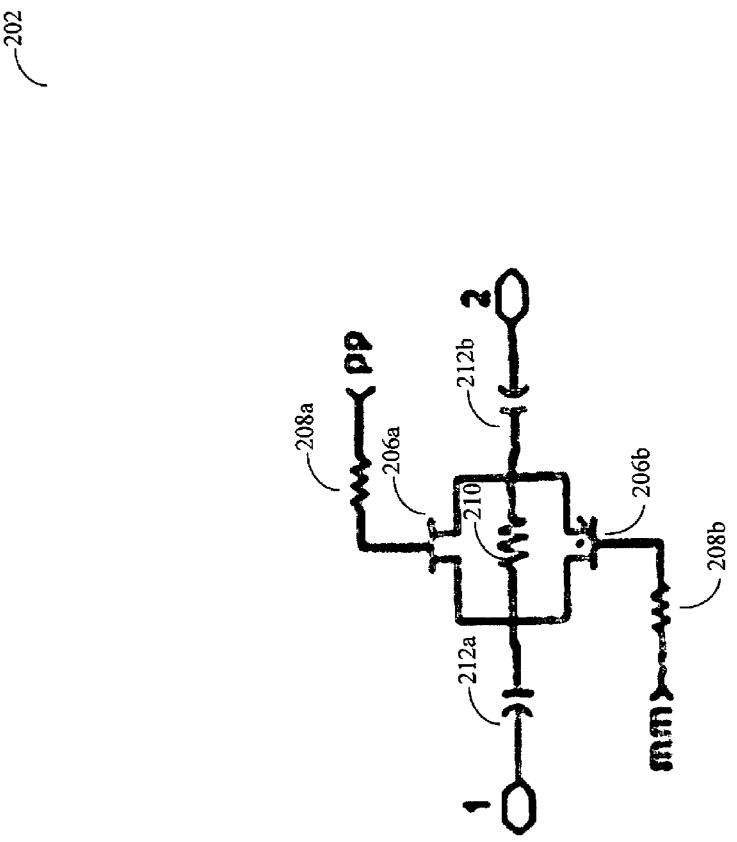
FIG. 2B is a diagram of an exemplary pass gate switch in accordance with an embodiment of the present disclosure.

FIG. 2B is a diagram of an exemplary pass gate switch used to implement pass gate switches 202 in accordance with an embodiment of the present disclosure. In an embodiment, pass gate switches 202 consist of P- and NMOS transistors 206 whose gates are driven by complementary control voltages $V_e$ and $\overline{V}_c$ to turn switches 202 on or off. In an embodiment, the control voltages are routed to the MOS devices 206 through high resistors 208 to isolate the control line from the drain-source RF path. An additional resistor 210 between drain and source can also be inserted in the pass gate structure to keep the DC potential across the channel constant. Finally, the RF path can be DC blocked by 2 capacitors 212 (e.g., MIM capacitors) at the drain and source nodes of the devices. Complementary switching behavior can be achieved by routing the $V_c$ and $\overline{V}_c$ control voltages to the appropriate gate of the N or PMOS transistors.

3.3 Exemplary Balun Circuit Modes

In an embodiment, when the appropriate switches are closed, the others are open and corresponding lines are either connected or disconnected to the balun's main windings. For example, in an embodiment, when one of switches 202*b-e* is toggled open or closed, other switches are toggled open or closed to make the windings balanced in balun circuit 201.

In an embodiment, switches 202 can be used to implement two modes for balun circuit 201. For example, in a first mode used to make a transmission line longer according to an embodiment of the present disclosure, switch 202*a* is closed, switch 202*b* is closed, switch 202*c* is open, switch 202*d* is closed, and switch 202*e* is open. In a second mode used to make a transmission line shorter according to an embodiment of the present disclosure, switch 202*a* is open, switch 202*b* is open, switch 202*c* is closed, switch 202*d* is open, and switch 202*e* is closed.

Thus, pass gates 202 can introduce additional loss when respective switches are closed (on) and additional series capacitance when open (off). Hence, optimum definition of pass gate switches 202 can be required for the balun of FIG. 2A to operate at high frequency. Further loss may be introduced by practical design considerations—for instance, vias can be introduced to allow the connection from the thick, top metal layers to the MOS terminals. In an embodiment, a balun can be based on lumped electrical components rather than windings of transmission line. Further, other embodiments of the invention may not use a planar balun or a silicon process to implement the balun.

The passive balun structure in the embodiment of the present disclosure shown in FIG. 2B has been simulated extensively with an electro-magnetic software package. In an embodiment, top metal layers in the available TowerJazz SBC18H3D process are the preferred metals for this embodiment of this invention. Because of the thickness of top metal layers, loss is reduced. It should be understood that use of top metal layers is not required in accordance with embodiments of the present disclosure. In an embodiment, the switches are designed independently of the balun windings. The size of the MOS transistors are designed to optimize their equivalent capacitive behavior when open and their equivalent loss when closed.

3.4 Using Multiple Coupled Switches to Select Length

While FIG. 2A is shown implemented with 5 switches, it should be understood that additional or fewer switches can be used. For example, by adding additional switches, the tunability of the balun of FIG. 2A can be further enhanced by enabling switching in and out different lengths of transmission line.

Figure 2C:
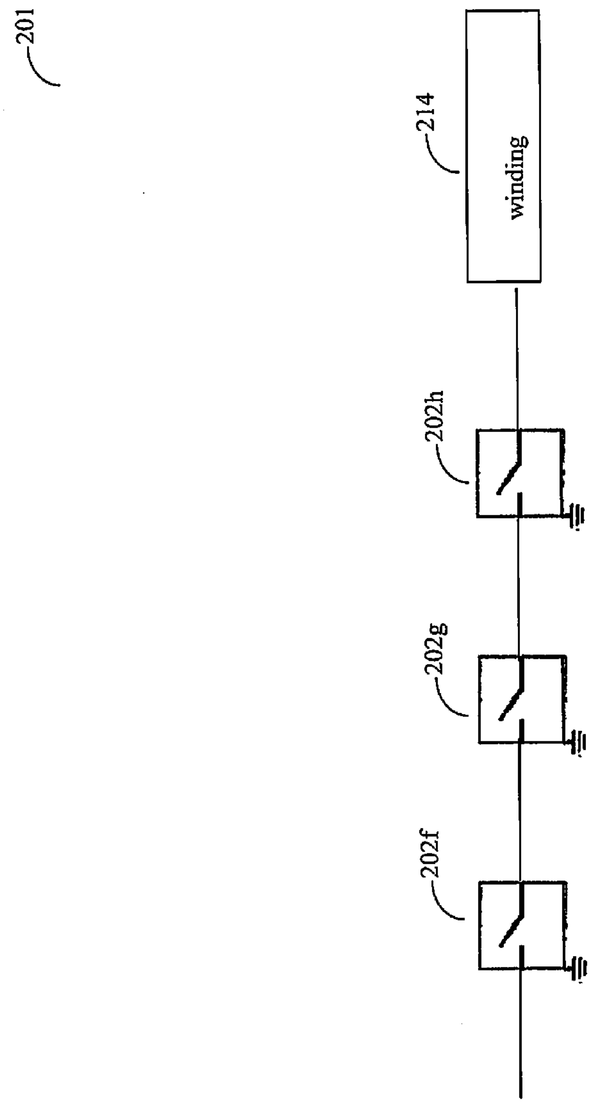
FIG. 2C is a diagram of an embodiment of a balun circuit using multiple switches coupled to a transmission line.

In an embodiment, multiple switches can be placed along a length of transmission line, and more or less of the transmission line can be switched in or out to provide a balun circuit with a desired transmission line length. FIG. 2C is a diagram of another embodiment of a balun circuit 201 using multiple switches 202*f*, 202*g*, and 202*h* coupled to a transmission line and one or more windings 214. For example, in an embodiment, each of switches 202*f*, 202*g*, and 202*h* can be switched into and/or out of balun circuit 201 of FIG. 2C to provide more or less transmission line length coupled to winding 214 to provide further frequency adjustability. In an embodiment, as shown in FIG. 2C, switches 202*f*, 202*g*, and 202*h* can be coupled together in series along a transmission line. However, it should be understood that switches can be coupled together along a transmission line using a variety of methods (e.g., coupled together in parallel, etc.) Further, other methods can be used to select more or less length of transmission line to be coupled to winding 214. For example, in an embodiment, a multiplexer can be used to select a variety of potential transmission lengths to be coupled to winding 214.

4. EXEMPLARY OPERATION

Figure 3:
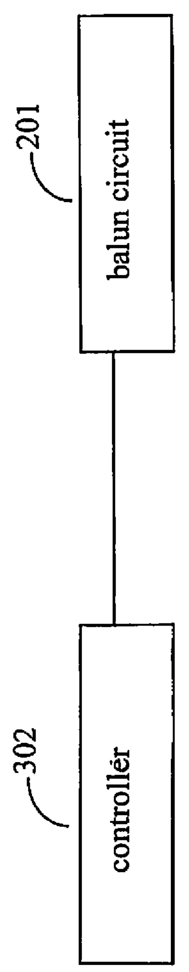
FIG. 3 is a block diagram of a device for controlling the frequency of a balun circuit in accordance with an embodiment of the present disclosure.

As discussed above, switches 202 can be used to select a particular length of line to connect to a balun circuit. Longer lines will optimize the balun performance at lower frequency, and shorter lines will make the balun operate at higher frequency. Switches 202 can be toggled on or off using a variety of methods in accordance with embodiments of the present disclosure. FIG. 3 is a block diagram of a device for controlling the frequency of a balun circuit in accordance with an embodiment of the present disclosure. FIG. 3 shows a controller 302 that is configured to control balun circuit 201. For example, in an embodiment, controller 302 can be used to determine whether switches should be toggled on or off.

Controller 302 can determine which switches 202 should be on and which switches 202 should be off using a variety of methods. For example, in an embodiment, controller 302 can receive input (e.g., from a human user and/or one or more sensors) instructing controller 302 to determine which switches should be switched on or off. Based on this input, controller 302 can send corresponding control signals to switches 202 of balun circuit 201 to toggle corresponding switches 202. In another embodiment, controller 302 can be sent information that can enable it to determine which of switches 202 should be toggled on or off, and, once controller 302 makes this determination, controller 302 can send corresponding control signals to switches 202 of balun circuit 201 to toggle corresponding switches 202.

For example, in an embodiment, controller 302 can be sent information regarding one or more desired frequencies of operation for balun circuit 201. This information can be sent to controller 302 by, e.g., a human user, one or more sensors, a computer program, a circuit coupled to controller 302, etc. As discussed above, longer lines will optimize the balun performance at lower frequency, and shorter lines will make the balun operate at higher frequency. Based on the desired frequenc(ies) of operation for balun circuit 201, controller 302 can determine one or more corresponding transmission line lengths for balun circuit 201 that will enable balun circuit 201 to meet or approximate the desired frequenc(ies) of operation. Based on the determined one or more corresponding transmission line lengths, controller 302 can determine which of switches 202 should be toggled on or off to satisfy or approximate the determined desired transmission line lengths. Based on the determined switches 202 to switch on or off, controller 302 can send corresponding control signals to switches 202 of balun circuit 201 to toggle corresponding switches 202.

Controller 302 can be implemented using hardware, software, or a combination of hardware and software. In an embodiment, controller 302 is implemented into balun circuit 201. In an embodiment, controller 302 and balun circuit 201 are implemented on the same device (e.g., using a single integrated circuit). In an embodiment, controller 302 and balun circuit 201 are implemented using separate devices.

Figure 4:
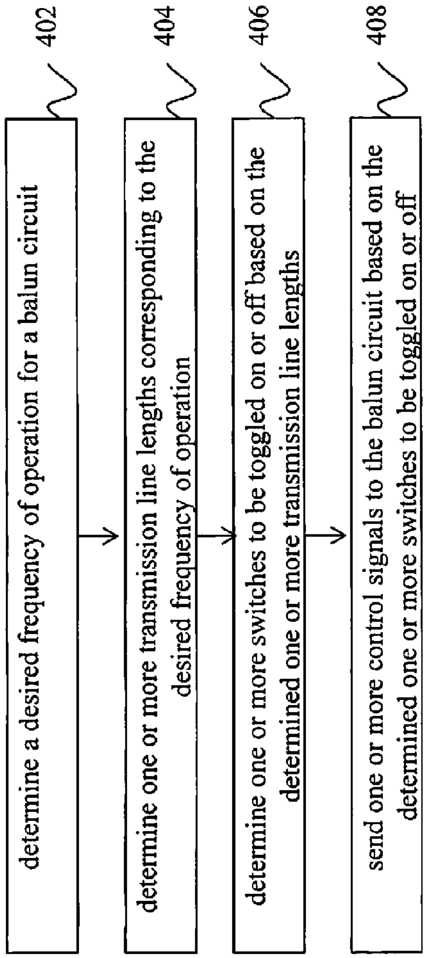
FIG. 4 is a flowchart of an exemplary method for controlling a balun circuit in accordance with an embodiment of the present disclosure.

FIG. 4 is a flowchart of an exemplary method for controlling a balun circuit in accordance with an embodiment of the present disclosure. In step 402, a desired frequency of operation for balun circuit 201 is determined (e.g., based on input received by controller 302). In step 404, one or more transmission line lengths corresponding to the desired frequency of operation are determined. For example, longer transmission lines will make balun circuit 201 operate at a lower frequency, and shorter lines will make balun circuit 201 operate at a higher frequency. In step 406, one or more switches 202 to be toggled on or off based on the determined one or more transmission line lengths are determined. For example, switches 202 can be used to switch in more transmission line length or to switch out transmission line length to prove a transmission line that satisfies or approximates the determined one or more transmission line lengths. In step 408, controller 302 sends one or more control signals to balun circuit 201 based on the determined one or more switches 202 to be toggled on or off.

5. CONCLUSION

It is to be appreciated that the Detailed Description, and not the Abstract, is intended to be used to interpret the claims. The Abstract may set forth one or more but not all exemplary embodiments of the present disclosure as contemplated by the inventor(s), and thus, is not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Any representative signal processing functions described herein can be implemented using computer processors, computer logic, application specific integrated circuits (ASIC), digital signal processors, etc., as will be understood by those skilled in the art based on the discussion given herein. Accordingly, any processor that performs the signal processing functions described herein is within the scope and spirit of the present disclosure.

The above systems and methods may be implemented as a computer program executing on a machine, as a computer program product, or as a tangible and/or non-transitory computer-readable medium having stored instructions. For example, the functions described herein could be embodied by computer program instructions that are executed by a computer processor or any one of the hardware devices listed above. The computer program instructions cause the processor to perform the signal processing functions described herein. The computer program instructions (e.g., software) can be stored in a tangible non-transitory computer usable medium, computer program medium, or any storage medium that can be accessed by a computer or processor. Such media include a memory device such as a RAM or ROM, or other type of computer storage medium such as a computer disk or CD ROM. Accordingly, any tangible non-transitory computer storage medium having computer program code that cause a processor to perform the signal processing functions described herein are within the scope and spirit of the present disclosure.

While various embodiments of the present disclosure have been described above, it should be understood that they have been presented by way of example only, and not limitation. It will be apparent to persons skilled in the relevant art that various changes in form and detail can be made therein without departing from the spirit and scope of the disclosure. Thus, the breadth and scope of the present disclosure should not be limited by any of the above-described exemplary embodiments.

What is claimed is:

1. A balun circuit configured to operate at a desired frequency of operation the balun circuit, the balun circuit comprising:

a winding coupled to a first length of transmission line;

a first switch coupled to the first length of transmission line, wherein the first switch is configured to couple a second length of transmission line to the winding when the first switch is closed; and a second switch coupled to the second length of transmission line, wherein the second switch is configured to couple a third length of transmission line to the winding when the second switch is closed, wherein the first switch and the second switch are configured such that a total length of transmission line coupled to the winding causes the balun circuit to operate at the desired frequency of operation.

2. The balun circuit of claim 1, wherein the desired frequency of operation of the balun circuit is determined based on the equation f=c/λ, where λ represents a wavelength of a signal passing through the total length of transmission line.

3. The balun circuit of claim 1, wherein the controller is configured to receive the information regarding the desired frequency of operation of the balun circuit from a user.

4. The balun circuit of claim 1, wherein the first switch and the second switch are configured to be opened or closed based on a mode of operation of the balun circuit.

5. The balun circuit of claim 4, wherein:

the first switch is opened and the second switch is closed when the balun circuit is operating in a first mode of operation, and the first switch is closed and the second switch is opened when the balun circuit is operating in a second mode of operation.

6. The balun circuit of claim 1, further comprising:

a third switch coupled to the third length of transmission line, wherein the fourth switch is configured to couple a fourth length of transmission line to the winding when the third switch is closed.

7. The balun circuit of claim 1, further comprising:

a controller, coupled to the winding, configured to:

receive information regarding the desired frequency of operation of the balun circuit, and instruct the first switch to be opened or closed based on the desired frequency of operation of the balun circuit.

8. The balun circuit of claim 7, wherein the controller is further configured to:

determine, based on the desired frequency of operation, the total length of transmission line to be coupled to the winding; and instruct the first switch to be opened or closed based on the determined total length of transmission line to be coupled to the winding.

9. The balun circuit of claim 8, wherein the controller is further configured to:

determine, based on the determined total length of transmission line to be coupled to the winding, whether the first switch should be opened or closed.

10. A device, comprising:

a balun circuit, comprising:

a winding coupled to a first length of transmission line;

a first switch coupled to the first length of transmission line, wherein the first switch is configured to couple a second length of transmission line to the winding when the first switch is closed, and a second switch coupled to the second length of transmission line, wherein the second switch is configured to couple a third length of transmission line to the winding when the second switch is closed; and a controller, coupled to the balun circuit, wherein the controller is configured to:

receive information regarding a desired frequency of operation of the balun circuit, determine a total transmission line length for the balun circuit corresponding to the desired frequency of operation, and determine whether the first switch and/or the second switch should be toggled based on the determined total transmission line length for the balun circuit, and send one or more control signals to the first switch and/or the second switch based on the determined total transmission line length for the balun circuit, wherein after the first switch and/or the second switch are toggled based on the one or more control signals, the balun circuit operates at the desired frequency of operation.

11. The device of claim 10, wherein the controller is configured to determine the total transmission line length for the balun circuit based on an equation that describes a property of a signal passing through the total transmission line length of the balun circuit.

12. The device of claim 11, wherein the equation is $V=V_o e^{-jkl}$, where V is the voltage at the end of a length l of transmission line, $V_o$ is the input voltage, and k is equivalent to 2π/λ, where λ represents a wavelength of the signal.

13. The device of claim 10, wherein the controller is configured to determine the total transmission line length for the balun circuit based on a wavelength of a signal passing through the total transmission line length of the balun circuit.

14. The device of claim 10, wherein the desired frequency of operation of the balun circuit is determined based on the equation f=c/λ, where λ represents a wavelength of a signal passing through the total length of transmission line.

15. The device of claim 10, wherein the controller is configured to receive the information regarding the desired frequency of operation of the balun circuit from a sensor.

16. A method for controlling a frequency of a balun circuit, the method comprising:

receiving information regarding a desired frequency of operation of the balun circuit;

determining a total transmission line length for the balun circuit corresponding to the desired frequency of operation based on an equation that describes a property of a signal passing through the total transmission line length, wherein the equation is $V=V_o e^{-jkl}$, and wherein V is the voltage at the end of length l of transmission line, $V_o$ is the input voltage, k is equivalent to 2π/λ, and λ represents a wavelength of the signal;

determining one or more switches to be toggled on or off based on the determined total transmission line length for the balun circuit; and sending one or more control signals to the determined one or more switches to be toggled on or off wherein, after the determined one or more switches are toggled based on the one or more control signals, the balun circuit operates at the desired frequency of operation.

17. The method of claim 16, wherein determining the one or more switches to be toggled on or off further comprises:

determining a number of switches that are coupled together in series along the total length of transmission line to be switched on based on the determined total transmission line length for the balun circuit.

18. The method of claim 16, wherein determining the total transmission line length for the balun circuit further comprises:

determining the total transmission line length for the balun circuit based on a wavelength of a signal passing through the total transmission line length of the balun circuit.

* * * * *